US012796461B2

(12) United States Patent
Pfefferlein et al.

(10) Patent No.: US 12,796,461 B2
(45) Date of Patent: Nov. 10, 2026

(54) SEMICONDUCTOR MODULE WITH HEAT SINK

(71) Applicant: Siemens Aktiengesellschaft, Munich (DE)

(72) Inventors: Stefan Pfefferlein, Heroldsberg (DE); Felix Zeyss, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 718 days.

(21) Appl. No.: 18/265,905

(22) PCT Filed: Nov. 3, 2021

(86) PCT No.: PCT/EP2021/080533
§ 371 (c)(1),
(2) Date: Jun. 7, 2023

(87) PCT Pub. No.: WO2022/122256
PCT Pub. Date: Jun. 16, 2022

(65) Prior Publication Data
US 2024/0038618 A1 Feb. 1, 2024

(51) Int. Cl.
*H10W 40/22* (2026.01)
*H10W 40/25* (2026.01)
(Continued)

(52) U.S. Cl.
CPC ....... *H10W 40/226* (2026.01); *H10W 40/255* (2026.01); *H10W 40/60* (2026.01);
(Continued)

(58) Field of Classification Search
CPC ..... H10W 40/226–228; H10W 70/681; H10W 90/401; H01L 23/3672; H01L 23/3677
See application file for complete search history.

(56) References Cited

U.S. PATENT DOCUMENTS 9,059,127 B1 * 6/2015 Lamorey ............. H10W 20/427
9,209,141 B2 * 12/2015 Lamorey ............... H10W 42/20
(Continued)

FOREIGN PATENT DOCUMENTS

CN 111863775 A 10/2020
WO WO 2018202439 A1 11/2018
(Continued)

OTHER PUBLICATIONS

PCT International Search Report and Written Opinion of International Searching Authority mailed Nov. 2, 2022 corresponding to PCT International Application No. PCT/EP2021/080533 filed Mar. 11, 2021.

*Primary Examiner* — Daniel Luke
(74) *Attorney, Agent, or Firm* — Henry M. Feiereisen LLC

(57) ABSTRACT

A semiconductor module includes a semiconductor element having a first side in contact with a first substrate in a planar manner, and a second side which faces away from the first side and contacts a metallic heat sink in a planar manner. The heat sink is in thermally conductive connection with the semiconductor element and connected to the second substrate in an electrically conductive manner. The heat sink includes a main body for planar contacting of the semiconductor element and a fin arranged in a recess of the second substrate. The second substrate is connected in an electrically conductive manner to the main body which has a circumferential contact surface around the fin to establish a material-bonded connection with a substrate metallization of the second substrate. The circumferential contact surface is arranged on a side of the main body facing away from the semiconductor element.

20 Claims, 4 Drawing Sheets

(51) Int. Cl.

| | |
|---|---|
| ***H10W 40/60*** | (2026.01) |
| ***H10W 70/68*** | (2026.01) |
| ***H10W 90/00*** | (2026.01) |
| *H10W 40/20* | (2026.01) |

(52) U.S. Cl.

CPC ....... *H10W 70/681* (2026.01); *H10W 90/401* (2026.01); *H10W 40/233* (2026.01)

(56) References Cited

U.S. PATENT DOCUMENTS

| | | | | |
|---|---|---|---|---|
| 10,141,182 | B1 * | 11/2018 | Molla | H10P 14/66 |
| 10,811,332 | B2 * | 10/2020 | Wu | H10W 40/22 |
| 2013/0299962 | A1 | 11/2013 | Ide et al. | |
| 2019/0355644 | A1 | 11/2019 | Zhong et al. | |
| 2020/0152532 | A1 | 5/2020 | Blank et al. | |
| 2020/0170111 | A1 | 5/2020 | Blank et al. | |
| 2020/0381370 | A1 | 12/2020 | Pfefferlein | |

FOREIGN PATENT DOCUMENTS

| | | | |
|---|---|---|---|
| WO | WO 2019015901 | A1 | 1/2019 |
| WO | WO 2019025314 | A1 | 2/2019 |

* cited by examiner

SEMICONDUCTOR MODULE WITH HEAT SINK

CROSS-REFERENCES TO RELATED APPLICATIONS

This application is the U.S. National Stage of International Application No. PCT/EP2021/080533, filed Nov. 3, 2021, which designated the United States and has been published as International Publication No. WO 2022/122256 A1 and which claims the priority of European Patent Application, Serial No. 20212848.4, filed Dec. 9, 2020, pursuant to 35 U.S.C. 119 (a)-(d).

BACKGROUND OF THE INVENTION

The invention relates to a semiconductor module comprising at least one semiconductor element.

The invention furthermore relates to a power converter comprising at least one such semiconductor module.

Moreover, the invention relates to a method for producing a semiconductor module comprising at least one semiconductor element.

Such semiconductor modules are usually used in a power converter. A power converter should, for example, be understood to be a rectifier, an inverter, a frequency converter or a DC/DC converter. Such semiconductor modules are, for example, realized by means of planar electronic packaging technology.

Published unexamined patent application WO 2018/202439 A1 describes an electronic assembly comprising a component that is held between a first substrate and a second substrate. According to the invention, it is provided that a gap between the first substrate and the component is connected to a through-hole such that a solder material, for example, can be dispensed through the through-hole using capillary forces acting in the through-hole and in the gap. Herein, the dispensing is automatic since the capillary forces only act in the gap. Tolerances which can be necessary because of differing gap dimensions can advantageously be compensated by the automatic dispensing of the solder material.

Published unexamined patent application WO 2019/015901 A1 describes an electrical assembly which has at least one electronic switching element which is electrically contacted on its underside and on its upper side which is opposite the underside. The electrical assembly also has two wiring supports which are arranged opposite one another on the electrical contacts. These wiring supports are each at least in part made of a permanently elastic, electrically insulating, thermally conductive material.

Published unexamined patent application US 2019/355644 A1 describes an IGBT module with a heat dissipation base plate.

Published unexamined patent application US 2013/299962 A1 describes a semiconductor apparatus with an IGBT as a vertical semiconductor element provided between first and second lead frames in pairs.

With such planar electronic packaging technology, it is difficult to integrate thermal capacities, in particular additional thermal capacities, due to the flat structure. Such thermal capacities are in particular required for high and short-term overload requirements in order, for example, to keep chip temperature fluctuations small.

Against this background, it is the object of the present invention to disclose a semiconductor module with greater reliability than the prior art.

SUMMARY OF THE INVENTION

According to the invention, the object is achieved by a semiconductor module comprising at least one semiconductor element, a first substrate and a second substrate, wherein the at least one semiconductor element is contacted on a first side with the first substrate in a planar manner and is contacted on a second side facing away from the first side with a metallic heat sink in a planar manner, wherein the metallic heat sink is in thermally conductive connection with the semiconductor element and is connected to the second substrate in an electrically conductive manner, wherein the metallic heat sink has a main body for planar contacting of the semiconductor element and at least one fin, wherein the second substrate is connected to the main body in an electrically conductive manner and has a recess in which the at least one fin is arranged, wherein the main body has a circumferential contact surface around the at least one fin via which a material-bonded connection is established with the substrate metallization of the second substrate, wherein the circumferential contact surface is arranged on a side of the main body facing away from the semiconductor element.

Moreover, according to the invention, the object is achieved by a semiconductor module comprising at least one semiconductor element, a first substrate and a second substrate, wherein the at least one semiconductor element is contacted on a first side with the first substrate in a planar manner and is contacted on a second side facing away from the first side with a metallic heat sink in a planar manner, wherein the metallic heat sink is in thermally conductive connection with the semiconductor element and is connected to the second substrate in an electrically conductive manner, wherein the metallic heat sink has a main body for planar contacting of the semiconductor element and at least one fin, wherein the second substrate is connected to the main body in an electrically conductive manner and has a recess in which the at least one fin is arranged, wherein the recess of the second substrate, has edge metallization, in particular circumferential edge metallization, via which a material-bonded connection with the metallic heat sink is established.

In addition, according to the invention, the object is achieved by a power converter comprising at least one such semiconductor module.

Moreover, according to the invention, the object is achieved by a method for producing a semiconductor module comprising at least one semiconductor element, a first substrate and a second substrate, wherein the at least one semiconductor element is contacted on a first side with the first substrate in a planar manner and is contacted on a second side facing away from the first side with a metallic heat sink in a planar manner, wherein a thermally conductive connection between the metallic heat sink and the semiconductor element is established and the metallic heat sink is connected to the second substrate in an electrically conductive manner, wherein the metallic heat sink has a main body for planar contacting of the semiconductor element and at least one fin, wherein the second substrate is connected to the main body in an electrically conductive manner and has a recess in which the at least one fin is arranged, wherein the main body has a circumferential contact surface around the at least one fin via which a material-bonded connection with the substrate metallization of the second substrate is established, wherein the circumferential contact surface is arranged on a side of the main body facing away from the semiconductor element.

In addition, according to the invention, the object is achieved by a method for producing a semiconductor module comprising at least one semiconductor element, a first substrate and a second substrate, wherein the at least one semiconductor element is contacted on a first side with the first substrate in a planar manner and is contacted on a second side facing away from the first side with a metallic heat sink in a planar manner, wherein a thermally conductive connection between the metallic heat sink and the semiconductor element is established and the metallic heat sink is connected to the second substrate in an electrically conductive manner, wherein the metallic heat sink has a main body for planar contacting of the semiconductor element and at least one fin, wherein the second substrate is connected to the main body in an electrically conductive manner and has a recess in which the at least one fin is arranged, wherein the main body has a circumferential contact surface around the at least one fin via which a material-bonded connection with the substrate metallization of the second substrate is established, wherein the circumferential contact surface is arranged on a side of the main body facing away from the semiconductor element.

The advantages and preferred embodiments listed below with respect to the semiconductor module can be applied mutatis mutandis to the power converter and the production method.

The invention is based on the concept of increasing the reliability of a semiconductor module by means of an on-chip metallic heat sink, also known as thermal capacity. The semiconductor module has at least one semiconductor element, a first substrate and a second substrate, wherein the at least one semiconductor element is contacted on a first side with the first substrate in a planar manner and is contacted on a second side facing away from the first side with the metallic heat sink in a planar manner. The second substrate is connected to the metallic heat sink in an electrically conductive manner and hence contacted with the semiconductor element via the metallic heat sink. Such a semiconductor element is, for example, embodied as a transistor, diode or logic module. In particular, the transistor is embodied as an insulated-gate bipolar transistor (IGBT), metal oxide semiconductor field-effect transistor (MOSFET) or field-effect transistor. The metallic heat sink is, for example, produced from copper, in particular solid copper, and/or a copper alloy. The contacting of the semiconductor element takes place for example via an electrically conductive thermal paste or via a material-bonded connection. As a result of the contacting, the metallic heat sink is in thermally conductive connection with the semiconductor element so that heat loss occurring in the semiconductor module is at least partially transferred to the metallic heat sink. In the metallic heat sink, the heat loss is, for example, stored and/or dissipated to the ambient atmosphere. The ambient atmosphere is, for example, air or a cooling fluid. Such an arrangement with a metallic heat sink can keep chip temperature fluctuations small, even with high and short-term overloads, thus resulting in an improvement in the reliability of the semiconductor module.

The metallic heat sink has a main body for planar contacting of the semiconductor element and at least one fin, wherein the second substrate is connected to the main body in an electrically conductive manner and has a recess in which the at least one fin is arranged. The main body has, for example, a rectangular contact surface. The planar contacting of the main body achieves optimal heat transfer. The at least one fin can be flush with the second substrate or protrude beyond the second substrate. In particular, the at least one fin is cuboidal or cylindrical in shape in order to achieve the greatest possible thermal capacity.

The main body has a circumferential contact surface around the at least one fin via which a material-bonded connection with the substrate metallization of the second substrate is established. In particular, the contact surface runs around the circumference of the recess of the second substrate. For example, the contact surface is embodied as a circumferential solder ring. Such a circumferential contact surface enables uniform heat distribution thus avoiding hot spots.

The circumferential contact surface is arranged on a side of the main body facing away from the semiconductor element. Such an arrangement of the circumferential contact surface causes the second substrate to at least partially rest on the main body thus resulting in mechanical stabilization of the arrangement and an increase in the contact surface.

The recess of the second substrate has edge metallization, in particular circumferential edge metallization, via which a material-bonded connection to the metallic heat sink is established. A capillary effect can cause a solder of the circumferential solder ring to rise over the edge metallization thus increasing the bonding surface of metallic heat sink to the second substrate and improving thermal bonding to the metallic heat sink.

A further embodiment provides that the semiconductor element is connected to the metallic heat sink in a materially bonded manner and/or wherein the metallic heat sink is connected to a substrate metallization of the second substrate in a materially bonded manner. Such a material-bonded connection is, for example, embodied as a soldered or sintered connection, thus resulting in improved thermal bonding.

A further embodiment provides that the semiconductor element is arranged in a potting chamber between the first substrate and the second substrate and wherein the potting chamber is sealed toward the recess by the material-bonded connection between the substrate metallization of the second substrate and the circumferential contact surface. The potting chamber comprises, for example, a potting compound, in particular an insulating potting compound, which, for example, contains silicone and serves to maintain the necessary voltage clearances and to protect against harmful environmental influences. The material-bonded connection with the circumferential contact surface means no additional sealing elements are required.

A further embodiment provides that the metallic heat sink is produced in one piece from a metallic material with a thermal conductivity of at least 240 W/(m-K) and/or an electrical conductivity of at least 40 MS/m is established. For example, the metallic heat sink is produced from copper or a copper alloy. A one-piece embodiment made of such a material can result in optimal thermal bonding.

A further embodiment provides that the metallic heat sink has a T-shaped cross-sectional profile. In particular, the larger area of the metallic heat sink with the T-shaped cross-sectional profile is provided for contacting the semiconductor element. Such a cross-sectional profile enables optimal thermal bonding to the semiconductor element and large-area contacting of the second substrate thus resulting in increased current-carrying capacity and reduced contact resistance.

BRIEF DESCRIPTION OF THE DRAWING

The following describes and explains the invention in more detail with reference to the exemplary embodiments depicted in the figures.

The figures show.

DETAILED DESCRIPTION OF PREFERRED EMBODIMENTS

The exemplary embodiments explained in the following are preferred embodiments of the invention. In the exemplary embodiments, the described components of the embodiments each represent individual features of the invention to be considered independently of one another, which also develop the invention independently of one another and are thus also be to regarded as a component of the invention individually or in a combination other than that shown. Furthermore, the described embodiments can also be supplemented by further of the features of the invention that have already been described.

The same reference symbols have the same meaning in the different figures.

Figure 1:
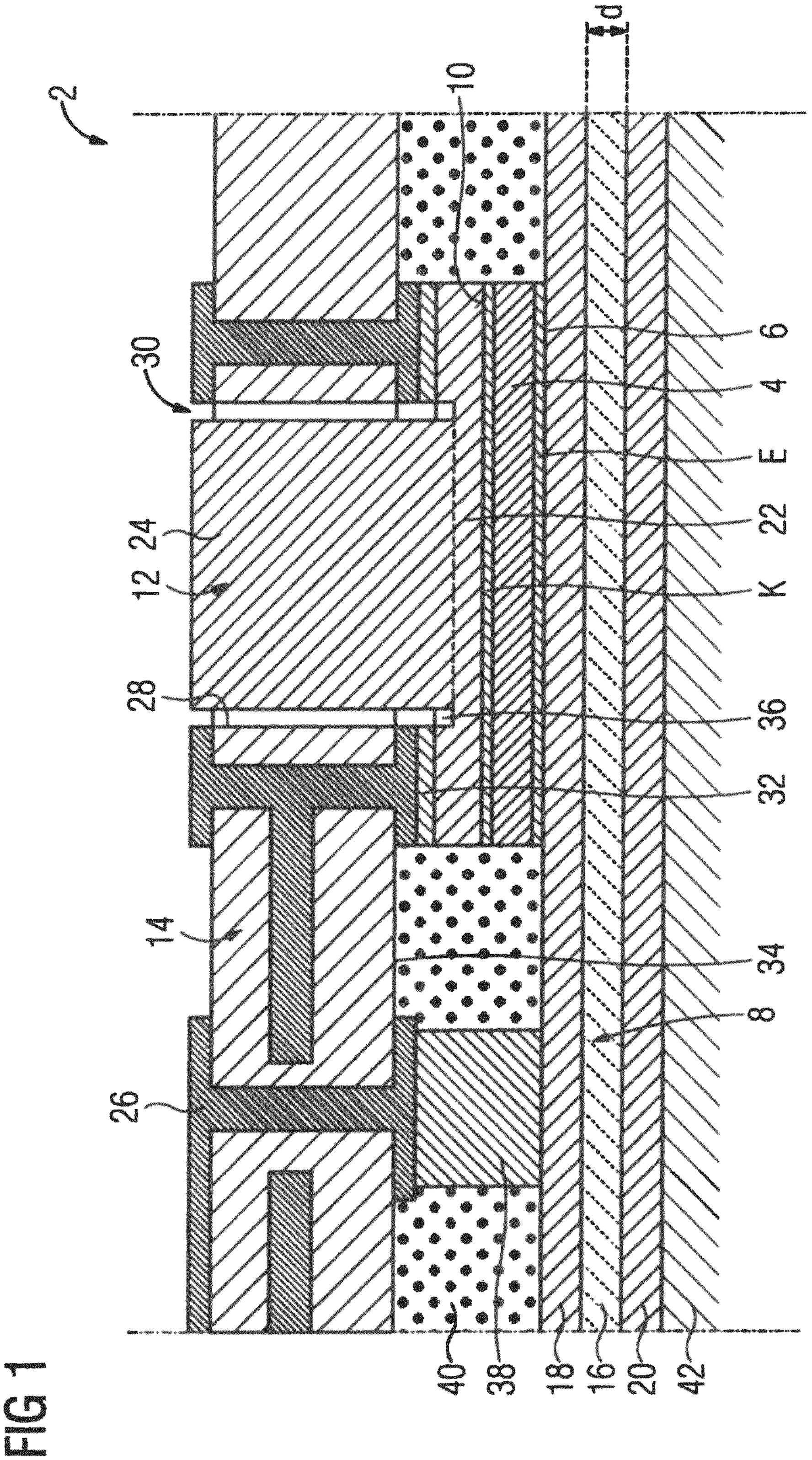
FIG. 1 a schematic representation of a first embodiment of a semiconductor module in cross section, FIG. 2 a schematic representation of a second embodiment of a semiconductor module in cross section, FIG. 3 a schematic representation of a third embodiment of a semiconductor module in cross section and FIG. 4 a schematic representation of a power converter with a semiconductor module.

FIG. 1 shows a schematic representation of a first embodiment of a semiconductor module 2 in cross section. The semiconductor module 2 comprises at least one semiconductor element 4, which is contacted on a first side 6 with a first substrate 8 in a planar manner and is contacted on a second side 10 facing away from the first side 6 with a metallic heat sink 12 in a planar manner. The metallic heat sink 12 is thermally coupled to the semiconductor element 4 and connected to the second substrate 14 in an electrically conductive manner. The planar contacting of the semiconductor module 2 with the first substrate 8 and the metallic heat sink 12 is, for example, established by a material-bonded connection, in particular a soldered or sintered connection, wherein the material-bonded connection of the semiconductor module 2 with the metallic heat sink 12 establishes the thermal coupling, so that heat loss occurring in the semiconductor module 2 is at least partially transferred to the metallic heat sink 12 where it is stored and/or dissipated into the ambient atmosphere, such as, for example, the ambient air or a cooling fluid.

The semiconductor element 4 is, by way of example, embodied as an insulated-gate bipolar transistor (IGBT) but can also be embodied as a metal oxide semiconductor field-effect transistor (MOSFET), field-effect transistor, diode, logic module, in particular field programmable gate array (FPGA) or as another type of semiconductor. In particular, the semiconductor element 4 has an area of at least 10 $mm^2$. For example, the semiconductor element 4 embodied as an IGBT is connected via an emitter contact E to the first substrate 8 and via a collector contact K to the metallic heat sink 12. A gate contact of the IGBT depicted in FIG. 1 is not shown for reasons of clarity.

The first substrate 8 comprises a dielectric material layer 16 containing a ceramic material, for example aluminum nitride or aluminum oxide, or an organic material, for example a polyamide, and has a thickness d of 25 μm to 400 μm, in particular 50 μm to 250 μm. Moreover, the first substrate 8 has upper metallization 18 on a side facing the semiconductor element 4 and lower metallization 20 on a side facing away from the semiconductor element 4, wherein the upper metallization 18 and the lower metallization 20 are, for example, produced from copper. In particular, the first substrate 8 is embodied as direct bonded copper (DBC).

The metallic heat sink 12 has a main body 22 for planar contacting of the semiconductor element 4 and, for example, a fin 24, wherein the metallic heat sink 12 is produced in one piece from a metallic material with a thermal conductivity of at least 240 W/(m·K) and/or an electrical conductivity of at least 40 MS/m. In particular, the metallic heat sink 12 is produced from copper or a copper alloy. For example, the metallic heat sink 12 has a T-shaped cross-sectional profile. While the main body 22 of the metallic heat sink 12 has a rectangular base and is, for example, embodied as a cubold, the fin 24 can, for example, be embodied as a cubold, cylinder or n-cornered prism, in particular a straight prism.

The second substrate 14 is embodied as a multilayer printed circuit board (PCB), wherein the layers of the printed circuit board have structured substrate metallization 26. Furthermore, the second substrate 14 has a recess 28, in which the fin 24 is arranged, wherein the main body 22 of the metallic heat sink 12 is connected to the substrate metallization 26 of the second substrate 14 in a materially bonded manner. In particular, the circumference of the fin 24 is surrounded by the recess 28, wherein an inner contour of the recess 28 is adapted to an outer contour of the fin 24 and wherein the recess 28 is spaced apart from the fin 24 by a gap 30 with a substantially constant width. On a side facing away from the semiconductor element 4, the main body 22 of the metallic heat sink 12 has a circumferential contact surface 32 running around the fin 24 via which the, in particular circumferential, material-bonded connection with the substrate metallization 26 is established on an underside 34 of the second substrate 14. The material-bonded connection of the circumferential contact surface 32 to the substrate metallization 26 is, for example, embodied as a circumferential solder ring and connects the collector contact K to the second substrate 14 via the main body 22 of the metallic heat sink 12. The fin 24 can be flush with the second substrate 24 or protrude beyond the second substrate 24. Between the circumferential contact surface 32 and the fin 24, the metallic heat sink 12 has a groove, in particular a circumferential groove 36.

Furthermore, a metallic spacer element 38 connecting the emitter contact E of the semiconductor element 4 to the second substrate 14 in an electrically conductive manner is arranged between the first substrate 8 and the second substrate 14. The metallic spacer element 38, which is also called a transfer element, is, for example, produced from copper, aluminum or one of their alloys. Moreover, the semiconductor element 4 is arranged in a potting chamber 40 between the first substrate 8 and the second substrate 14, which is filled, in particular completely, by a potting compound. The potting chamber 40 is sealed toward the recess 28 by the material-bonded connection between the substrate metallization 26 of the second substrate 14 and the circumferential contact surface 32 of the metallic heat sink 12. In addition, the first substrate 8 is connected to a metallic base plate 42, which, is, for example, embodied as a heat sink, in particular in a materially bonded manner.

Figure 2:
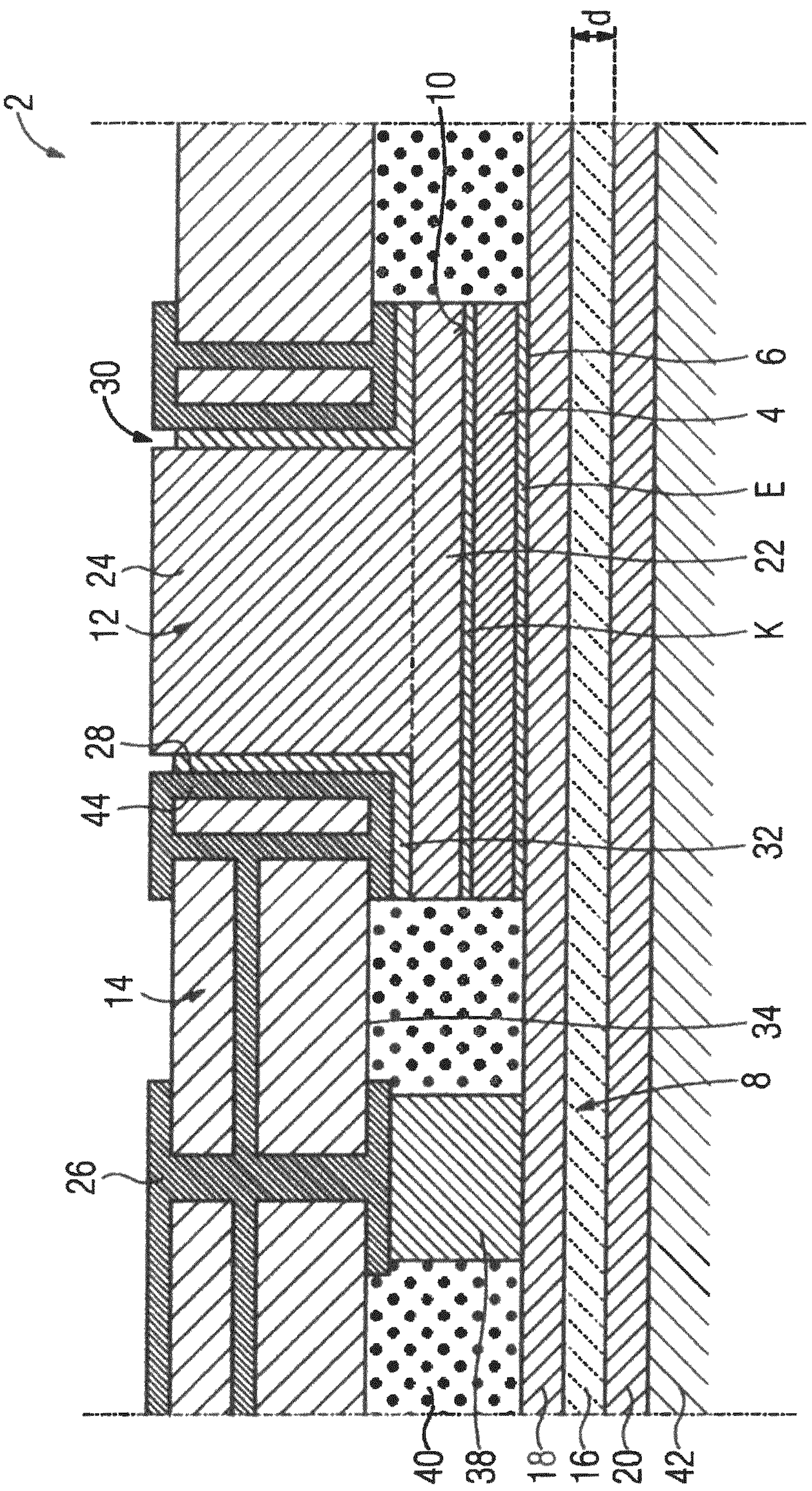

FIG. 2 shows a schematic representation of a second embodiment of a semiconductor module 2 in cross section. The recess 28 of the second substrate 14 has edge metallization, in particular circumferential edge metallization 44, over which, for example, the solder of the circumferential solder ring can rise, so that additionally a material-bonded connection of the edge metallization 44 with the metallic heat sink 12 is established, thus resulting in an increase in the bonding surface of the metallic heat sink 12 to the second substrate 14. The further embodiment of the semiconductor module 2 in FIG. 2 corresponds to that in FIG. 1.

Figure 3:
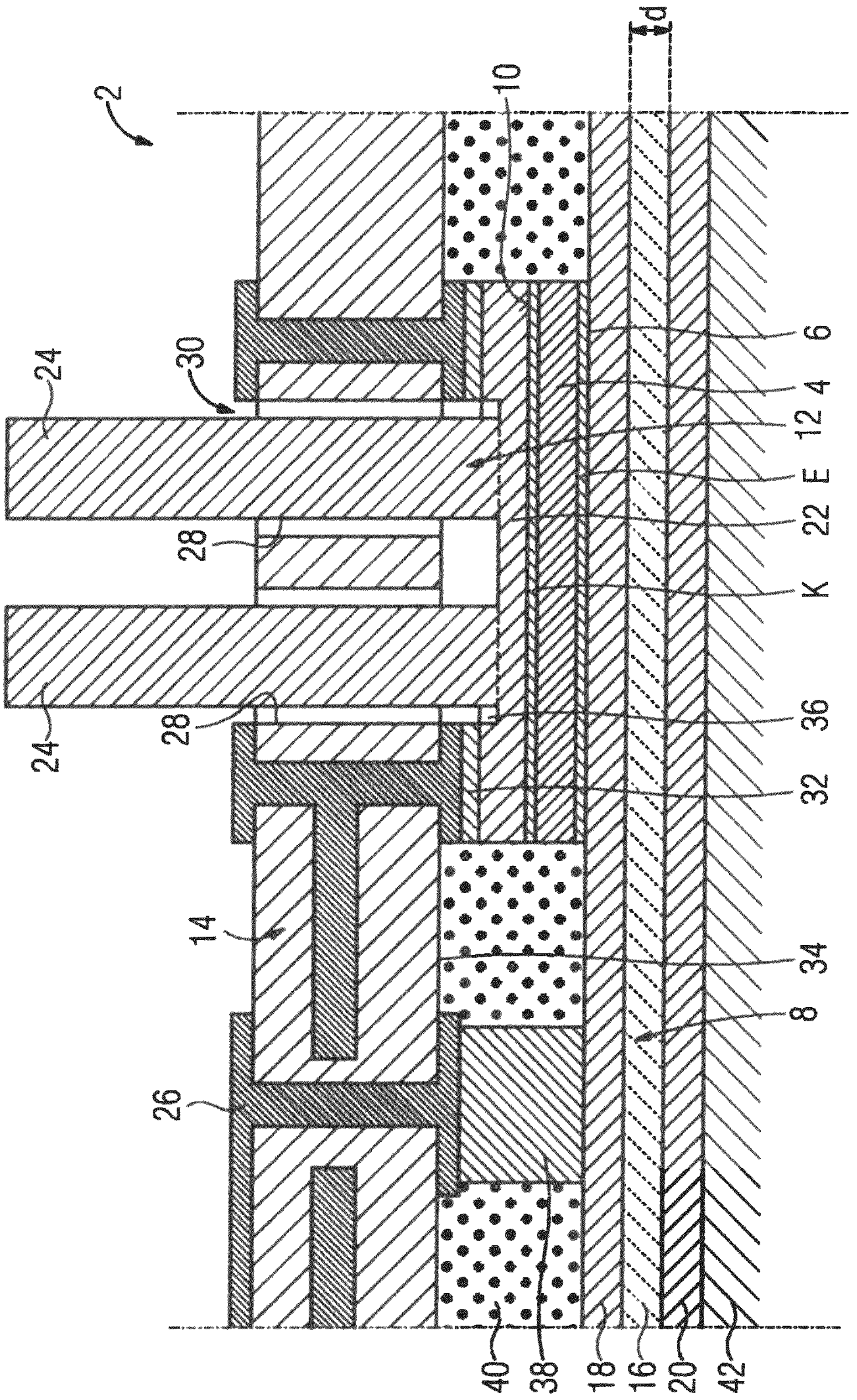

FIG. 3 shows a schematic representation of a third embodiment of a semiconductor module 2 in cross section. The one-piece metallic heat sink 12 has, for example, two fins 24 each of which is arranged in a recess 28 of the second substrate 14. However, the metallic heat sink 12 can also have, for example, 4, 6, 8 or 16 fins 24, which are in particular arranged on the main body 22 in such a way that uniform heat dissipation from the semiconductor element 4 takes place. By way of example, the fins 24 are embodied as identical, for example they are each cuboid or cylindrical, and protrude over the second substrate 24, so that heat loss occurring in the semiconductor module 4 is at least partially dissipated to the ambient atmosphere over as large an area as possible.

Figure 4:
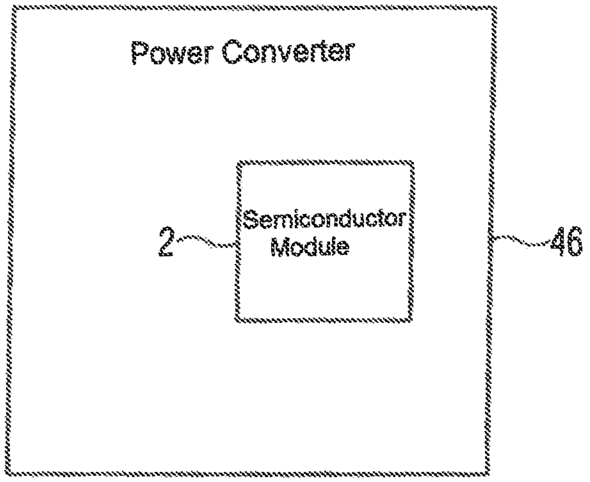

FIG. 4 shows a schematic representation of a power converter 46 with a semiconductor module 2. The power converter 46 can comprise more than one semiconductor module 2.

In summary, the invention relates to a semiconductor module 2 comprising at least one semiconductor element 4, a first substrate 8 and a second substrate 14. In order to achieve higher reliability compared to the prior art, it is proposed that the at least one semiconductor element 4 is contacted on a first side 6 with the first substrate 8 in a planar manner and is contacted on a second side 10 facing away from the first side 6 on a second side 10 with a metallic heat sink 12 in a planar manner, wherein the metallic heat sink 12 is in thermally conductive connection with the semiconductor element 4 and connected to the second substrate 14 in an electrically conductive manner.

What is claimed is:

1. A semiconductor module, comprising:

a first substrate;

a second substrate having a recess;

a semiconductor element having a first side in contact with the first substrate in a planar manner, and a second side which faces away from the first side; and a metallic heat sink in contact with the second side of the semiconductor element in a planar manner, said metallic heat sink being in thermally conductive connection with the semiconductor element and connected to the second substrate in an electrically conductive manner, said metallic heat sink including a main body for planar contacting of the semiconductor element and a fin arranged in the recess of the second substrate, with the second substrate being connected to the main body in an electrically conductive manner, said main body having a circumferential contact surface around the fin to establish a material-bonded connection with a substrate metallization of the second substrate, said circumferential contact surface being arranged on a side of the main body facing away from the semiconductor element.

2. The semiconductor module of claim 1, wherein the semiconductor element is connected to the metallic heat sink in a materially bonded manner.

3. The semiconductor module of claim 1, further comprising a potting chamber between the first substrate and the second substrate, said semiconductor element being arranged in the potting chamber, wherein the potting chamber is sealed toward the recess by the material-bonded connection between the substrate metallization of the second substrate and the circumferential contact surface.

4. The semiconductor module of claim 1, wherein the recess of the second substrate includes an edge metallization to further assist the material-bonded connection of the second substrate with the metallic heat sink.

5. The semiconductor module of claim 4, wherein the edge metallization is a circumferential edge metallization.

6. The semiconductor module of claim 1, wherein the metallic heat sink is produced in one piece from a metallic material with a thermal conductivity of at least 240 W/(m·K) and/or an electrical conductivity of at least 40 MS/m.

7. The semiconductor module of claim 1, wherein the metallic heat sink has a T-shaped cross-sectional profile.

8. A semiconductor module, comprising:

a first substrate;

a second substrate having a recess;

a semiconductor element having a first side in contact with the first substrate in a planar manner, and a second side which faces away from the first side; and a metallic heat sink in contact with the second side of the semiconductor element in a planar manner, said metallic heat sink being in thermally conductive connection with the semiconductor element and connected to the second substrate in an electrically conductive manner, said metallic heat sink Including a main body for planar contacting of the semiconductor element and a fin arranged in the recess of the second substrate, with the second substrate being connected to the main body in an electrically conductive manner, wherein the recess of the second substrate includes an edge metallization to further assist a material-bonded connection of the second substrate with the metallic heat sink.

9. The semiconductor module of claim 8, wherein the edge metallization is a circumferential edge metallization.

10. The semiconductor module of claim 8, wherein the main body has a circumferential contact surface around the fin to establish a material-bonded connection with a substrate metallization of the second substrate.

11. The semiconductor module of claim 10, wherein the circumferential contact surface is arranged on a side of the main body facing away from the semiconductor element.

12. The semiconductor module of claim 10, further comprising a potting chamber between the first substrate and the second substrate, said semiconductor element being arranged in the potting chamber, wherein the potting chamber is sealed toward the recess by the material-bonded connection between the substrate metallization of the second substrate and the circumferential contact surface.

13. A power converter, comprising the semiconductor module as set forth in claim 1.

14. A power converter, comprising the semiconductor module as set forth in claim 8.

15. A method, comprising:

contacting a first side of a semiconductor element with a first substrate in a planar manner;

contacting a second side of the semiconductor element, which second side faces away from the first side, with a metallic heat sink in a planar manner, with the metallic heat sink including a main body for planar contacting of the semiconductor element;

establishing a thermally conductive connection between the metallic heat sink and the semiconductor element;

connecting the metallic heat sink to the second substrate in an electrically conductive manner;

arranging a fin of the heat sink in a recess of the second substrate;

establishing a material-bonded connection of a circumferential contact surface of the main body around the fin with a substrate metallization of the second substrate; and arranging the circumferential contact surface on a side of the main body facing away from the semiconductor element.

16. The method of claim 15, further comprising connecting the semiconductor element to the metallic heat sink in a materially bonded manner and/or connecting the metallic heat sink to the substrate metallization of the second substrate in a materially bonded manner.

17. The method of claim 15, further comprising:

arranging the semiconductor element in a potting chamber between the first substrate and the second substrate; and sealing the potting chamber toward the recess by the material-bonded connection between the substrate metallization of the second substrate and the circumferential contact surface.

18. The method of claim 15, further comprising applying an edge metallization to the second substrate in an area of the recess to further assist the material-bonded connection of the second substrate to the metallic heat sink.

19. The method of claim 18, wherein the edge metallization is a circumferential edge metallization.

20. A method, comprising:

contacting a first side of a semiconductor element with a first substrate in a planar manner;

contacting a second side of the semiconductor element, which second side faces away from the first side, with a metallic heat sink in a planar manner, with the metallic heat sink including a main body for planar contacting of the semiconductor element;

establishing a thermally conductive connection between the metallic heat sink and the semiconductor element;

connecting the metallic heat sink to the second substrate in an electrically conductive manner;

arranging a fin of the heat sink in a recess of the second substrate;

establishing a material-bonded connection of a circumferential contact surface of the main body around the fin with a substrate metallization of the second substrate; and arranging the circumferential contact surface on a side of the main body facing away from the semiconductor element.

* * * * *